（12） United States Patent
Bezama et al.

(10) Patent No.: US 7,802,442 B2
(45) Date of Patent: *Sep. 28, 2010

(54) HIGH POWER MICROJET COOLER

(75) Inventors: Raschid J. Bezama, Mahopac, NY (US); Govindarajan Natarajan, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 2 days.

This patent is subject to a terminal disclaimer.

(21) Appl. No.: 12/182,304

(22) Filed: Jul. 30, 2008

(65) Prior Publication Data

US 2008/0282720 A1    Nov. 20, 2008

Related U.S. Application Data

(63) Continuation of application No. 11/308,504, filed on Mar. 30, 2006, now Pat. No. 7,536,870.

(51) Int. Cl.
*F25D 23/12*    (2006.01)
(52) U.S. Cl. ....................... 62/259.2; 62/310
(58) Field of Classification Search .......... 62/310, 62/304, 259.2
See application file for complete search history.

(56) References Cited

U.S. PATENT DOCUMENTS

| 5,220,804 | A | * | 6/1993 | Tilton et al. .................... 62/64 |
| 5,388,635 | A | | 2/1995 | Gruber et al. |
| 6,459,581 | B1 | | 10/2002 | Newton et al. |
| 6,606,251 | B1 | | 8/2003 | Kenny, Jr. et al. |
| 6,650,542 | B1 | | 11/2003 | Chrysler et al. |
| 6,678,168 | B2 | | 1/2004 | Kenny, Jr. et al. |

* cited by examiner

*Primary Examiner*—Melvin Jones
(74) *Attorney, Agent, or Firm*—DeLio & Peterson, LLC; Kelly M. Nowak; Joseph Petrokaitis

(57) ABSTRACT

A distribution apparatus, system and method for thermal control whereby a plate of a manifold assembly has predetermined surface features positioned on specific locations on a surface thereof for enhancing the cooling capabilities of the assembly. The predetermined surface features of the plate delay a velocity decay of a fluid impinging the surface of the plate, while also increase the surface area of the plate exposed to the impinging liquid, which in turn, maximize both the reliability and thermal performance of the overall thermal system at a given maximum operating pressure.

20 Claims, 7 Drawing Sheets

HIGH POWER MICROJET COOLER

BACKGROUND OF THE INVENTION

1. Field of the Invention

The present invention relates to cooling electronic devices, and in particular, to a cooling structure that enhances the cooling capability of high power dissipating devices and methods of manufacturing such cooling structure.

2. Description of Related Art

Modern electronic devices, such as those having increased power densities, operating frequencies and current leakages, as well as devices having small cooling fluid thermal budgets or having very high average power flux, are continually requiring improved thermal structures for providing enhanced thermal capabilities. For instance, in an electronic device having a high average power flux, a high power hot spot may dissipate 200 to 500 W/cm$^2$, while a very high power hot spot may dissipate more than 500 W/cm$^2$. Under such processing conditions, conventional thermal technologies, such as heat spreaders, heat sinks, and associated thermal interfaces, will undesirably increase the power flux and generate high thermal gradients along the cooling axis.

To address the problems associated with these high thermal gradients, single-phase fast-forced convection and/or a two-phase evaporation based devices with a circulating fluid have been introduced in the art. These types of cooling devices commonly include a body having a number of liquid jets that impinge a target surface, along with lateral drains for removing spent fluid from between the cooling device body and the target surface. In this manner, the high kinetic energy of the array of fluid jets provide fluid in close proximity to the surface for enabling a high cooling rate of the target, particularly at the location where the jets impinge. However, this high heat/cooling transfer rate decreases rapidly in areas of the surface not residing directly below the surface area being impinged, which leads to uneven cooling of the target. Also, the lateral drains remove spent fluid in a radial flow pattern away from a fluid jet with a maximum velocity at the periphery of the jet array, and as such, are insufficient for cooling high power flux situations.

Current fluid jet arrays also require a high fluid flow rate, which in turn, results in an undesirable increase in pressure drop on the cooler. Known circulating cooling fluid solutions also have a maximum operating pressure for preventing fluid leakage and mechanical damage to the system. Since increasing the fluid velocity typically increases cooling capabilities, an increase in fluid velocity in conventional cooling devices to provide high cooling capabilities, such as above 400 W/cm$^2$, would deleteriously generate high operating pressures that exceed the device pressure limits. As such, the pressure drop required to operate modern electronic devices having high power flux situations limits the extendibility of conventional cooling devices.

Therefore, a need continues to exist in the art for improved thermal assemblies, and methods of making such assemblies, that maximize the heat transfer rate of fluid jet arrays for cooling/heating components having high power flux, while simultaneously controlling the fluid pressure drop in the cooling assemblies.

SUMMARY OF THE INVENTION

Bearing in mind the problems and deficiencies of the prior art, it is therefore an object of the present invention to provide optimized thermal fluid assemblies, and methods of making such assemblies, having increased cooling capabilities for use in high power flux situations.

It is another object of the present invention to provide thermal fluid assemblies, and methods of making such assemblies, that maximize heat transfer rates while enabling low pressure drops.

Another object of the invention is to provide thermal fluid assemblies, and methods of making such assemblies, having uniform heat transfer rate capabilities that are independent of the shape, and size of the surface of the heat generating body being cooled.

Still another object of the present invention is to provide thermal fluid assemblies, and methods of making such assemblies, that are consistent, reliable, time efficient and cost effective.

Yet another object of the present invention is to provide thermal fluid assemblies, and methods of making such assemblies, that are capable of cooling at a rate above about 400 W/cm$^2$ with total internal liquid pressure drops below 10 psig.

Still other objects and advantages of the invention will in part be obvious and will in part be apparent from the specification.

The above and other objects, which will be apparent to those skilled in art, are achieved in the present invention, which is directed to a distribution assembly for thermal control of a substrate. The assembly includes a plate having predetermined surface features residing on an exposed surface area thereof, and a manifold attached to the plate. The manifold has a microjet array and a distributed drain. A cavity resides between the manifold and the exposed surface area of the plate and the surface features. The microjet array emits a fluid, whereby the predetermined surface features delay a velocity decay of the fluid within the cavity, particularly within a wall jet region of the cavity, thereby enhancing thermal control of the assembly.

In this aspect of the invention, the manifold and plate may be made of materials having compatible thermal coefficients of expansion. The plate and surface features may be a monolithic one-piece structure, or they may be two distinct components attached to one another and made of materials having compatible thermal coefficients of expansion. While the plate may be a cooling plate or a heating plate, the subsequent text of this disclosure will only refer to the cooling aspect of this device mainly to simplify its description, but it is understood that the same device details also apply to the heating problems. The manifold may be attached to the plate to provide a fully encapsulated thermal distribution assembly. A heat generating component may also be attached to the plate for controlling a temperature thereof. In the invention, the more surface area of the predetermined surface features of the plate that are exposed to the impinging fluid jet velocity, the higher the rate of thermal control for the assembly. Also, it is critical that the predetermined surface features reside on the exposed surface area of the plate in locations such that these surface features avoid destroying the circulation pattern created by the fluid emitted from the microjet array.

The manifold preferably includes a plurality of cells, whereby each cell has a microjet substantially at a center thereof and a distributed drain network. The predetermined surface features also have a configuration corresponding to the plurality of cells, such that, the surface features do not interfere with the fluid emitted from the microjet array. In accordance with the invention, the predetermined surface features of the plate may include a plurality of circular cavities aligned with individual cells of the manifold, circular cavities with inwardly projecting fins, a plurality of fin patterns, or even combinations thereof for meeting desired specifications.

In another aspect, the invention is directed to a system for thermal heat transfer. The system includes a substrate having a temperature in need of modulating, and a cooling plate attached to the substrate. The cooling plate has an exposed surface area with predetermined surface features. A manifold is attached to the cooling plate, whereby the manifold has a microjet array and a distributed drain. A cavity resides between the manifold and the exposed surface area of the cooling plate, whereby the microjet array emits a fluid into the cavity for contact with such exposed surface area. The surface features delay a velocity decay of the fluid, thereby enhancing thermal control of the cooling plate. By enhancing thermal control of the cooling plate, the temperature of the substrate is also controlled.

In still another aspect, the invention is directed to a method for thermally controlling a temperature. A plate having predetermined surface features residing on an exposed surface area thereof is provided along with a manifold having a distributed drain and a plurality of microjets for emitting a fluid. The plate is attached to the manifold such that the surface features avoid alignment with the microjets, thereby not interfering with the impinging jet stream ejected from the micojets. Upon emitting the fluid from the microjets, the fluid contacts the plate in locations of the exposed surface area that are surrounded by the surface features. In so doing, the predetermined surface features maintain a velocity distribution of the fluid at these locations where the fluid contacts the exposed surface area to delay a velocity decay of the fluid for enhancing thermal control of the assembly. Any spent fluid is removed via the distributed drain.

The manifold and plate preferably comprise materials having compatible thermal coefficients of expansion, whereby a variety of different predetermined surface features may reside across the exposed surface area of the plate for controlling a variety of different temperatures on the plate. The emitted fluid may be either a cooling fluid or a heating fluid. The manifold may also include a plurality of cells having a microjet substantially at a center of each cell. The surface features of the plate have a configuration correlating to the designs of such cells within the manifold, such that, these surface features do not interfere with the fluid emitted from the microjet array. Again, the predetermined surface features may include a plurality of circular cavities aligned with individual cells of the manifold, circular cavities with inwardly projecting fins aligned with the cells, a plurality of fin patterns, or even combinations thereof for meeting desired specifications. The manifold also includes a distributed drain with drain hole distribution that approximately matches the plurality of cells distribution.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1A-7 of the drawings in which like numerals refer to like features of the Invention.

The present invention is directed to methods and structures for increasing cooling capabilities of single-phase microjet array coolers without a proportional increase in the system operating pressure. Higher cooling capabilities for a given operating pressure results in a cooling assembly that functions at lower operating temperatures, which in turn, increases the assembly's reliability and/or performance. In accordance with the invention, a manifold is attached to a surface of a plate that has predetermined surface features residing across such surface. Upon a fluid jet stream impinging the plate surface at a location surrounded by the surface features, such surface features advantageously delay a velocity decay of such impinging fluid for enhancing thermal control of the plate.

Figure 1A:
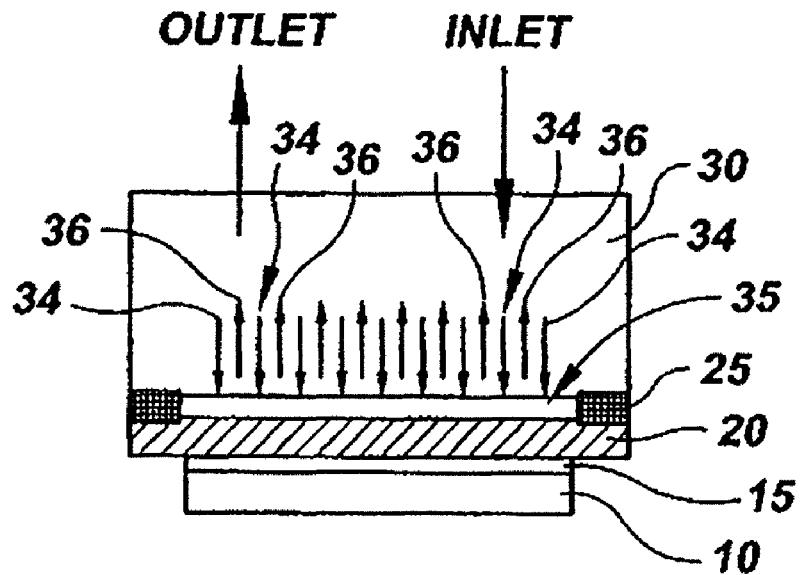
FIG. 1A is a cross sectional view of a thermal assembly including a liquid impingement manifold having a fluid microjet array with a distributed drain network attached to a planar cold plate.
Figure 1B:
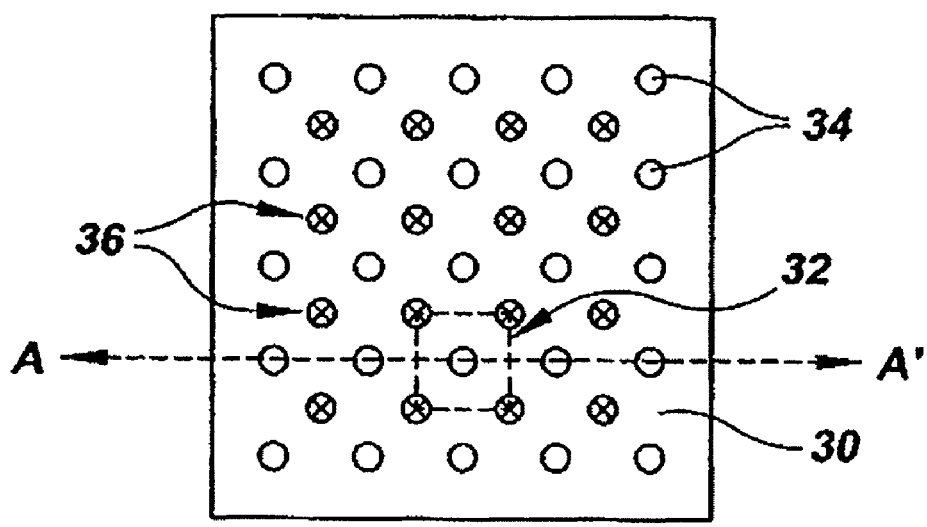
FIG. 1B is a top plan view of the liquid impingement manifold of FIG. 1A showing each microjet within the assembly being surrounded by a number of distributed drains.

Referring to FIGS. 1A-1B, a heat generating component 10 in need of thermal control, such as a semiconductor chip, is attached to another heat transferring component, hereinafter referred to as a cooling plate 20, via a thermal paste or solder 15. A temperature of the cooling plate 20 is controlled, which in turn controls the temperature of the heat generating component 10, using a liquid impingement manifold 30. It should be appreciated and understood that any type of manifold apparatus may be used in accordance with the invention so long as such manifold has an array of microjets for ejecting an impinging liquid onto a surface in need of thermal control, and a distributed drain consisting of an array of drain holes, henceforth referred to as via drains 36, for removing spent liquid between the manifold and the impinged surface.

For ease of understanding the invention, and not to limited the invention in any way, a preferred liquid impingement manifold 30 includes an array of fluid microjets 34 traversing a thickness of the manifold in a direction orthogonal to the target surface. A network of via drains 36 also traverses a thickness of the manifold in a direction orthogonal to the target surface and parallel with the fluid microjet array. The array of fluid microjets 34 and network of via drains 36 are designed and configured into a number of predetermined sub-millimeter cooling cells 32 within the manifold body, wherein each fluid microjet 34 is surrounded by at least 3 via drains 36, preferably 4 via drains 36, or even more. As such, these cooling cells 32 have at least three (3) vertexes whereby a drain 36 is positioned on each vertex, with a single microjet 34 being located substantially at the center of the cooling cell 32. Preferably, the fluid microjet array and the distributed drain network have substantially the same density distribution throughout manifold.

It should be appreciated and understood that the cooling cells may have a variety of sizes and finite geometrical shapes including, but not limited to, squares, triangles, and the like. For instance, referring to FIG. 2B, the cooling cells 32 may be formed into an array of square cells whereby each square cooling cell includes a fluid microjet 34 substantially at a center thereof surrounded by 4 via drains 36. In this aspect, the fluid microjet within the square cooling cell is surrounded by the processing power of one entire via drain (i.e., 4 vertices with a drain at each vertex having ¼ the processing power provides the cell with the processing power of one full drain). Alternatively, the cooling cells may be formed into an array of triangular cells (not shown), whereby the individual drains are divided into one sixth portions amongst the triangular cells, such that the fluid microjet is surrounded by ½ the power of a via drain. Since a square cooling cell has one entire via drain for each fluid microjet within a given cell, this type of configuration is preferred, as compared to the triangular cooling cell arrangement which has half a via drain per cooling cell; therefore, this cooling cell will also have a lower pressure drop for a given set of operating and design conditions.

While the above designs are only two configurations of a cooling cell, it should be appreciated that the cooling cells may be configured with a variety of other uniform and/or non-uniform shapes and sizes within a single manifold. The advantage of using a combination of cooling cells of varying shapes and sizes is the ability to provide a manifold with cooling flux capability that changes from high heat transfer rates in areas with small cells to lower heat transfer rates in areas with relatively larger cells. This advantageously enables the formation of a manifold with cooling capabilities that match the expected cooling dissipation distribution of the target surface to be cooled, thereby minimizing the total fluid flow required to cool the heat generating component. For instance, a manifold having a non-uniform pattern of a combination of local cooling cells of varied shapes and sizes is particularly useful for cooling high power chips with local hot spots.

In any cooling cell configuration, it is critical that the via drains 36 are located closer to a given fluid microjet 34 within a given cooling cell 32 as compared to adjacent microjet-to-microjet distances. As such, any interactions between adjacent fluid microjets 34 within adjacent cooling cells 32 are effectively decoupled, and undesirable lateral drain flows between local cooling cells are substantially or entirely eliminated. The manifold 30 is attached to the cooling plate 20 such that a cavity 35 is formed between the manifold 30 and the cooling plate 20. To maximize the thermal performance of the manifold, the manifolds are preferably formed with a dimensionless minimum inlet microjet pitch (i.e., ratio between the lowest pitch of two adjacent inlet microjets and the microjet hydraulic diameters) of about 3 to about 4 dimensionless units, and a dimensionless gap height (i.e., ratio between the cavity height and the microjet hydraulic diameters) of about 2 to about 3 dimensionless units. A maximum height within the cavity 35 directly under the microjet is referred to as the gap height.

Referring to the drawings, an attachment means 25 attaches the manifold 30 to the cooling plate 20 for thermal control of the heat generating component 10. The attachment means 25 provides a way to define and control the gap height to a desired optimal level. Attachment means 25 can be made from metal, plastics, or ceramic and can be attached to manifold 30 and cooling plate 20 with any means such as adhesives, pastes, solders, and the like, or even combinations thereof. Alternatively, the attachment means 25 can be an integral part of either manifold 30 or cooling plate 20, thus reducing the number of assembly steps.

Another method to control the gap height is to use adhesives, solders, or pastes, with properly sized spacers inside as attachment means 25. The manifold 30 is formed by MLC (multilayer ceramic) processing using a material that has a low intrinsic thermal conductivity, and a TCE that closely matches the TCE of the cooling plate 20. For instance, the manifold may be made of a glass-ceramic material, silicon, Invar™, AlN, SiC, Cu, Ni and the like, polymers and plastics or even combinations thereof. A material that matches the TCE of the cooling plate 20 is preferred since it facilitates direct sealing between the manifold 30 and the cooling plate 20, particularly when the manifold is a fully encapsulated module, i.e., the manifold 30 fully encapsulates the cavity 35 of the assembly. In the preferred embodiment, the cooling plate 20 comprises a silicon plate, while the manifold comprises a glass-ceramic material that has a low intrinsic thermal conductivity, preferably about 2 W/mK, and a TCE that closely matches the TCE of silicon, or about $3.0 \text{ E}{-}6 \text{ K}^{-1}$.

Figure 2A:
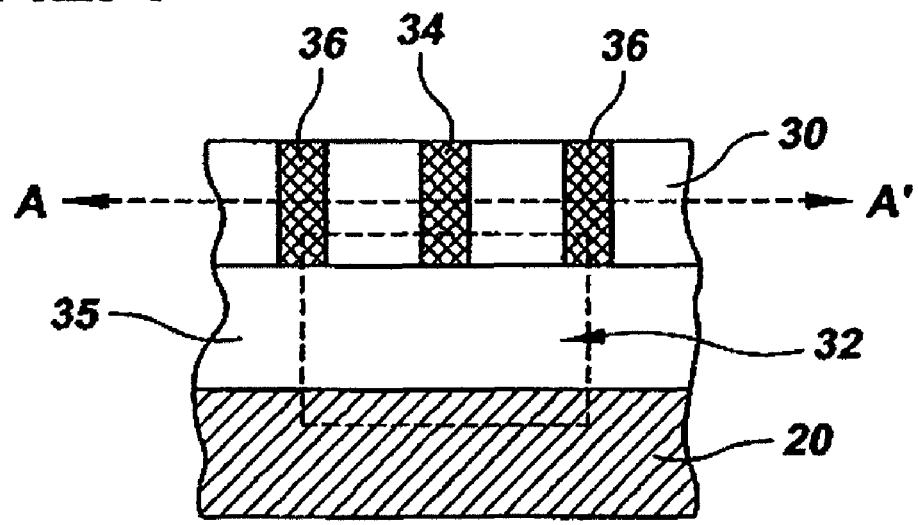
FIG. 2A is a cross sectional exploded view of a portion of the assembly of FIG. 1A, as designated by the dashed lines and through line A-A' of FIG. 1B.
Figure 2B:
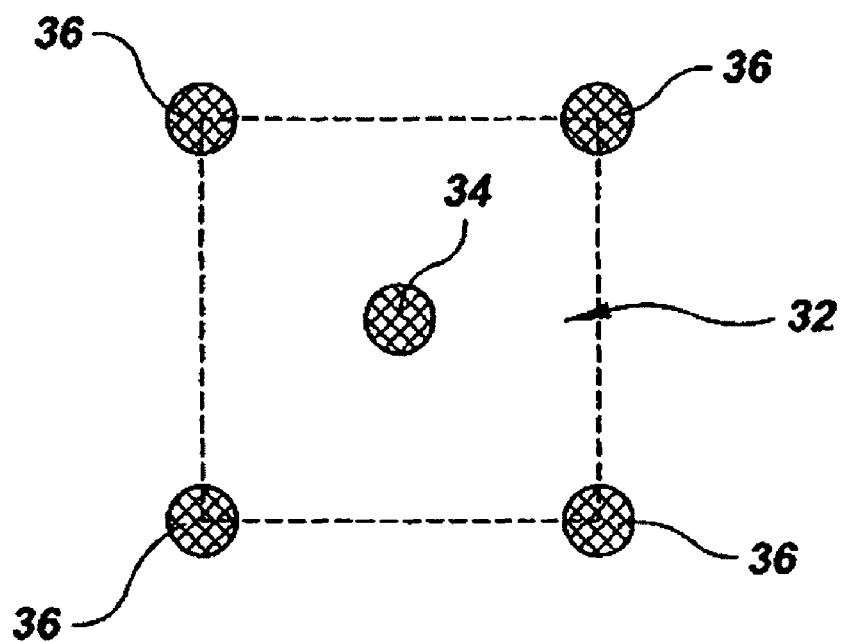
FIG. 2B is a top perspective view of the assembly portion shown in FIG. 2A.

Referring to FIGS. 2A-2B, when the manifold 30 is attached to the cooling plate 20, the fluid microjets 34 provide a cooling fluid from a top surface of the manifold in an inflow velocity orthogonal to the target surface of the cooling plate. The cooling fluid exits the microjets and contacts the target surface to cool such surface at a predetermined cooling rate distribution. The network of drains 36 then remove spent cooling fluid from the cavity 35 directly over the cooling plate 20 target surface at an outflow velocity also orthogonally away from the target surface. In so doing, the drains 36 intake the spent fluid from the bottom surface of the manifold and remove spent fluid at the manifold 30 top surface. Optionally, the manifold may be provided with a lateral drain flow (not shown) for removing a small fraction of the overall drain flow, which may be particularly useful for purging the assembly and/or for removing any undesirable debris, bubbles, or other extraneous materials.

In the thermal cooling assembly of FIGS. 2A-2B, the cooling plate 20 has a substantially planar surface area. In this assembly, as a fluid is ejected from the microjets 34 onto the planar cooling plate 20 target surface, its impingement over the surface creates a stagnation zone with high pressure where the fluid changes direction from vertical to horizontal relative to the impinged surface, thus creating a thin wall jet. In the wall jet, the velocity of the fluid is highest above the boundary layer over the periphery of the location where the fluid directly impinges the target surface. As the fluid disperses or expands from this location, the fluid velocity continually decreases as a given flow rate of fluid finds an increasing flow area to flow thru. This area, perpendicular to the wall jet velocity vector increases proportionally with the distance to the jet centerline. Since the thermal boundary layer thickness also increases, the farther away from the impingement location, the lower the fluid velocity and the lower is the local heat transfer rate. Thus, while the heat transfer rate is very high on the impinged area directly under the fluid jet, this heat transfer rate decays exponentially away from the jet centerline. The exponential heat transfer rate decay, caused by the combination of increasing flow area and wall friction, begins at approximately 0.75 to 1.0 jet diameters away from the jet center.

Figure 3:
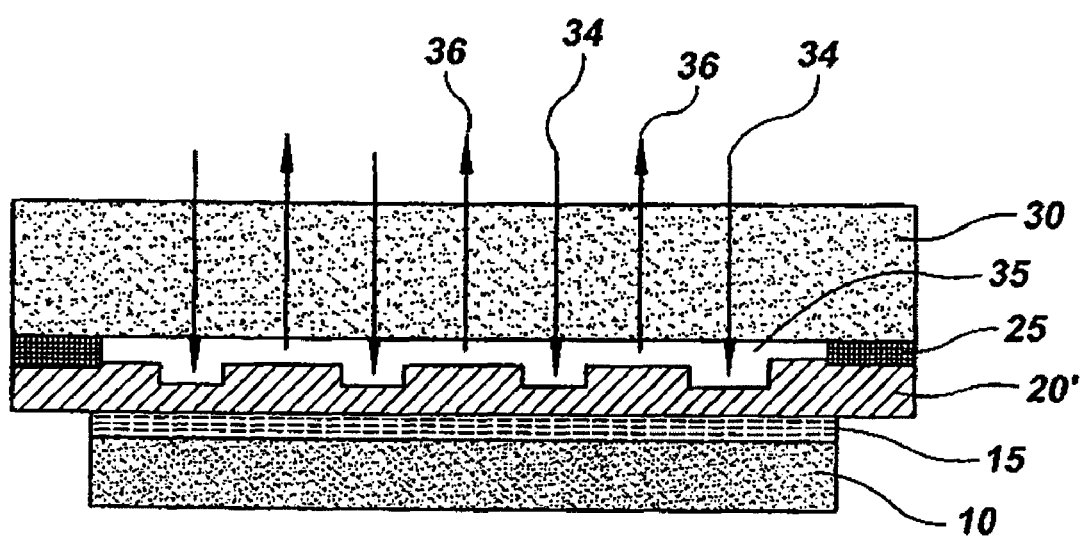
FIG. 3 is a cross sectional view of a thermal assembly of the invention having the liquid impingement manifold of FIGS. 1A-2B attached to a modified cold plate having predetermined surface features that enhance the cooling capabilities of the assembly.

While the embodiment of FIGS. 1A-2B provide superior cooling capabilities as compared to conventional techniques, it has been found that by providing a modified cooling plate 20' having predetermined, specifically placed surface features on its target surface area can even further maximize the cooling capabilities of the assembly at a given maximum operating pressure. These predetermined surface features maintain the fluid velocity at the location where the fluid jet impinges the modified cooling plate 20' target surface. By maintaining the fluid velocity, a decay of such fluid velocity is delayed, which in turn, ultimately enhances the cooling capabilities of the entire thermal cooling assembly. Also, the surface features increase the surface area of the cooling plate 20' for contact with the ejected fluid which also enhances the cooling capabilities by increasing the rate of cooling. Such an assembly is shown in FIG. 3. For instance, the modified cooling plate 20' having predetermined, specifically positioned surface features may have maximized cooling capabilities up to about 2, or even 3, times higher than the cooling capabilities of the planar cooling plate 20 target surface assembly.

In one aspect of the invention, the present modified cooling plate is formed from a single piece of starting plate material. The starting plate material is provided, and then a predetermined pattern is provided over the starting plate surface. The starting plate is preferably a silicon substrate. The predetermined pattern provided over the plate surface correlates with the desired surface feature patterns to be formed on the resultant cooling plate 20'. Using conventional photolithography techniques, the pattern is etched into the starting plate to a depth sufficient to form the desired surface features for maximizing the cooling capabilities of the thermal cooling assembly. In this manner, the resultant cooling plate is a monolithic one-piece structure.

For example, if the starting plate is about 700 microns thick, the pattern may be etched into the starting plate to a depth ranging from about 100 microns to about 200 microns deep, or even further, provided that the etch depth plus the thickness of attachment means 25 approximately match the desired gap height. It should be appreciated that depending on the initial starting plate substrate thickness and the end use of the resultant modified cooling plate 20' (i.e., the thermal requirements for cooling/heating a semiconductor component), the predetermined surface features may be formed to a variety of depths within the starting substrate. These depths are also dependent upon a number of thermal control processing conditions including, but not limited to, the distance from the microjet outlet to the target surface 24 within the surface features, ejected fluid pressures, heating/cooling requirements of the device being cooled, and the like.

In another aspect, the present modified cooling plate may be a two-piece structure. In this embodiment of the invention, a starting plate layer with a desired thickness may be provided, and then the surface features are formed in a thermally conductive second layer residing over the starting plate layer. The starting plate layer and the second layer may be of the same material, or they may be different materials that have compatible coefficients of thermal expansion. For instance, the thermally conductive starting plate and second layers may include, but are not limited to, layers of silicon, aluminum nitride, silicon carbide, metal composites, and the like.

The thermally conductive second layer may be provided directly over the starting plate layer, followed by providing a predetermined pattern over the second layer that correlates with the desired surface feature patterns to be formed in the second layer. The pattern is etched into the second layer to a depth sufficient to form the desired surface features. Alternatively, these desired surface features may be formed in the second layer prior to attaching the second layer to the plate layer. Once the patterned second layer is formed, it is then attached to the plate layer to form the resultant modified cooling plate 20. Again, depending on the initial starting plate substrate and second plate thicknesses, along with the end use of the resultant modified cooling plate 20' (i.e., the thermal requirements for cooling/heating a semiconductor component), the predetermined surface features may be formed to a variety of heights. These heights are also dependent upon a number of thermal control processing conditions including, but not limited to, the distance from the microjet outlet to the target surface 24 within the surface features, ejected fluid pressures, heating/cooling requirements of the device being cooled, and the like.

In either the one-piece assembly of the invention, or the two-piece assembly of the invention, it is critical that the predetermined surface features are formed, or provided, in locations of the cooling plate 20' surface such that the surface features do not destroy the fluid thermal boundary layer under the fluid jet, while simultaneously increasing the fluid-wall thermal exchange efficiency. In so doing, the surface features delay a velocity decay of fluid within a wall jet region of the cavity. A variety of different surface feature patterns may be formed on the cooling plate surface, so long as each surface feature pattern increases the thermal performance of the cooling assembly without an equivalent proportional increase in pressure drop. While there may be minimal pressure drop associated with the present modified cooling plates 20', such pressure drop, if any, is insignificant due to the added surface area of the modified cooling plate 20' which preserves the fluid circulation paths over the cooling plate target surface. While the added surface area is proportional to the surface feature pattern height, with consequent increase in thermal performance, this additional area also increases the pressure drop within the cavity 35. An optimal design with minimal pressure drop increase requires a surface feature height, which is a function of the surface feature plan pattern, since some of these patterns will not work properly if they have full gap height size vertically. A preferred surface feature pattern design will have a pattern height greater than 30% but lower than 80% of the gap height if 100% height is not feasible according to a prescribed pressure drop budget.

Figure 4A:
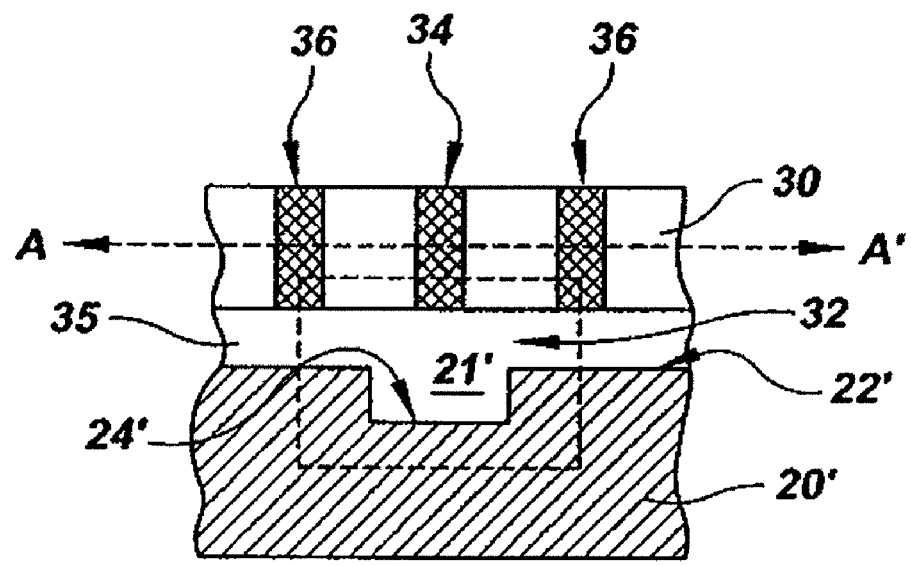
FIGS. 4A-B are exploded views of a portion of an assembly of the invention showing the modified cold plate having predetermined surface features of round cavities.
Figure 4B:
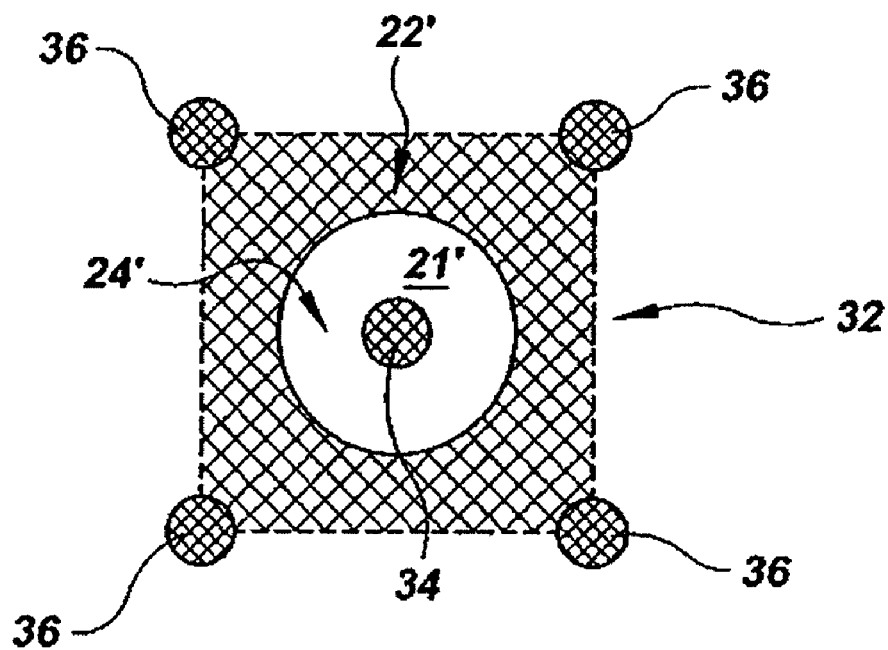

Referring to FIGS. 4A-4B, the starting substrate may be provided with a number of predetermined surface features of circular cavities 21' across the substrate surface. Each circular cavity 21' is formed in a location corresponding to an individual cooling cell 32 such that the cooling plate substrate is provided with the same number of circular cavities 21' as the number of cooling cells 32 residing in the thermal manifold 30. The circular cavities 21' are formed in the cooling plate substrate using the design parameters of the distributed drain network and microjet array of the manifold, such that, upon attaching the manifold 30 to the modified cooling plate 20', each cooling cell 32 is aligned with a single circular cavity 21'. The circular cavity 21' resides substantially at a center of the cooling cell 32, with the single microjet 34 of the cooling cell 32 residing substantially at a center of the circular cavity 21'.

In operation, fluid is ejected from the microjets 34 and directly impinges the cooling plate surface 24' within the circular cavities 21'. Upon contact, the fluid circulates within the circular cavities 21' such that the fluid thermal boundary layer and the fluid velocity is substantially maintained at the location where the fluid contacts the cooling plate surface 24' within the circular cavity 21', with subsequent thermal boundary layer expansion as the wall jet develops, and then reduced again at the base of the vertical walls that define circular cavities 21' by the abrupt change in fluid velocity direction. As the fluid moves up the cavity side wall, there is no further expansion of the area perpendicular to the wall jet velocity vector; thus, the wall jet decay is no longer accelerated by the flow area change, hence maintaining an advantageous higher heat transfer rate than in the case of a flat plate. The upward fluid flow also enhances fluid circulation created by the incoming fluid jet. Advantageously, maintaining the fluid circulation within the surface features minimizes any pressure drop increase in the assembly while increasing fluid mixing and promoting heat exchange with the heated surfaces. As fluid is continually ejected, a fluid vortex is formed within the circular cavity 21' that extends up over the top surface 22' of the modified cooling plate 20' for further cooling, and is eventually exhausted from the assembly by the drains 36. The surface features of circular cavities 21' adds surface area to the cooling plate 20', and as such, the increased surface area in combination with the maintained fluid velocity at the location of fluid impingement significantly increases the heat transfer coefficient to maximize thermal performance, while controlling thermal flux distribution within the thermal cooling assembly.

Figure 5A:
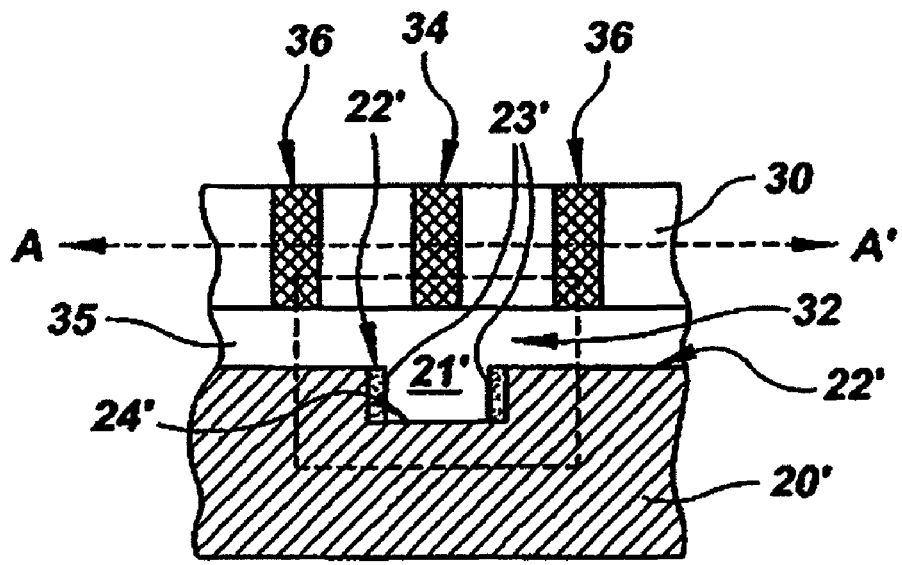
FIGS. 5A-B are exploded views of a portion of an assembly of the invention showing the modified cold plate having predetermined surface features of round cavities with inwardly projecting fins.
Figure 5B:
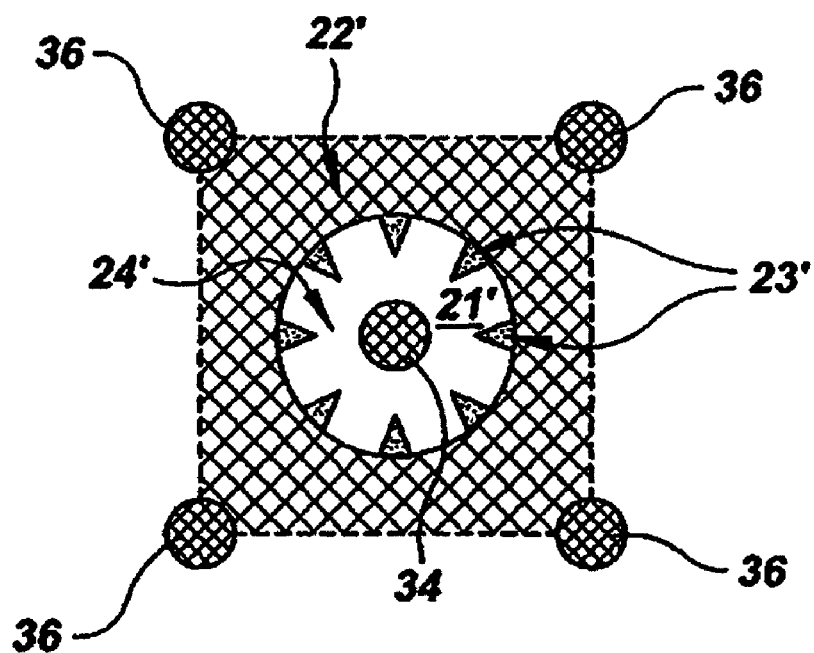

As an alternative approach, the circular cavities 21' may be formed with inwardly projecting fins 23', as is shown in FIGS. 5A-5B. These circular cavities 21' with their inwardly projecting fins 23' of the cooling plate body may be formed using conventional photolithographic techniques by patterning and etching a starting substrate with such patterns. The fins 23' extend into the circular cavities 21' in an amount sufficient to maintain the fluid circulation within the circular cavities, while simultaneously increasing the exposed cooling plate 20' surface area for contact with the fluid flow for increasing the heat transfer coefficient of the assembly even further. Preferably, the fins 23' do not reside in locations where the fluid is to impinge the cooling plate surface 24'. For instance, the fins 23' may extend into the circular cavities 21' up to a distance of about 2 a microjet 34 diameter away from a circumference of where the impinging fluid is to contact the cooling plate surface 24'. That is, where the microjets 34 have a measurable diameter, the fins 23' may extend into the circular cavities 21' to a distance of approximately 1 full jet diameter away from a center of the circular cavity 21', which is also a center location of where the fluid is to impinge the cooling plate surface. In so doing, the fluid circulation within the circular cavities having fins is not destroyed such that any pressure drop within the assembly is kept to a minimum. Further, fins 23' can be tailored in a way that keeps the area perpendicular to the wall jet velocity vector approximately constant and equal to the area near the fins front edge (relative to the wall jet flow vector), again delaying the wall jet exponential decay in heat transfer rate, and preserving the fluid circulation pattern around the jet. Thus, fins 23' promote additional heat transfer between the hot surfaces and the fluid vortex because the fluid vortex high velocity section flows through the volume enclosed by the fins.

Figure 6A:
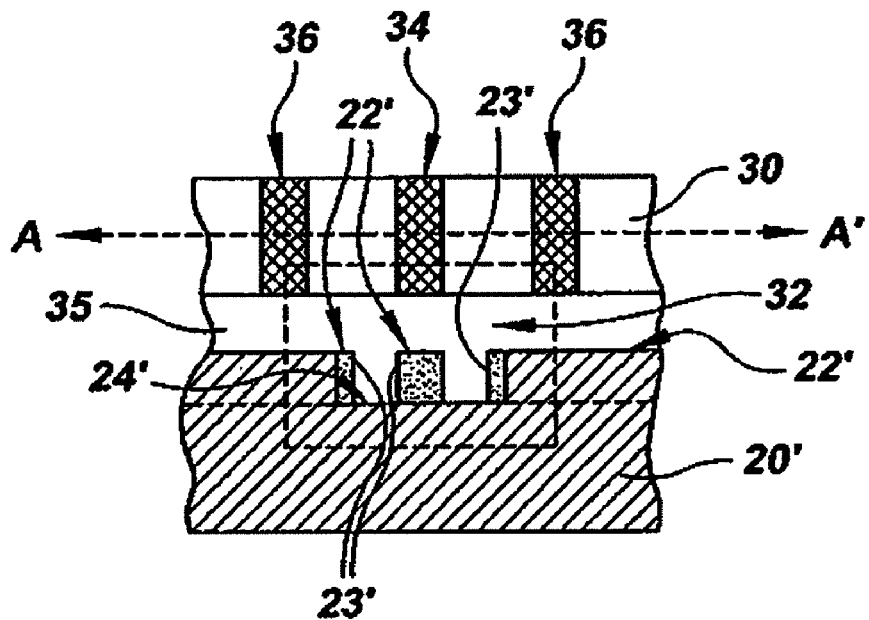
FIGS. 6A-B are exploded views of a portion of an assembly of the invention showing the modified cold plate having predetermined surface features of patterned fins.
Figure 6B:
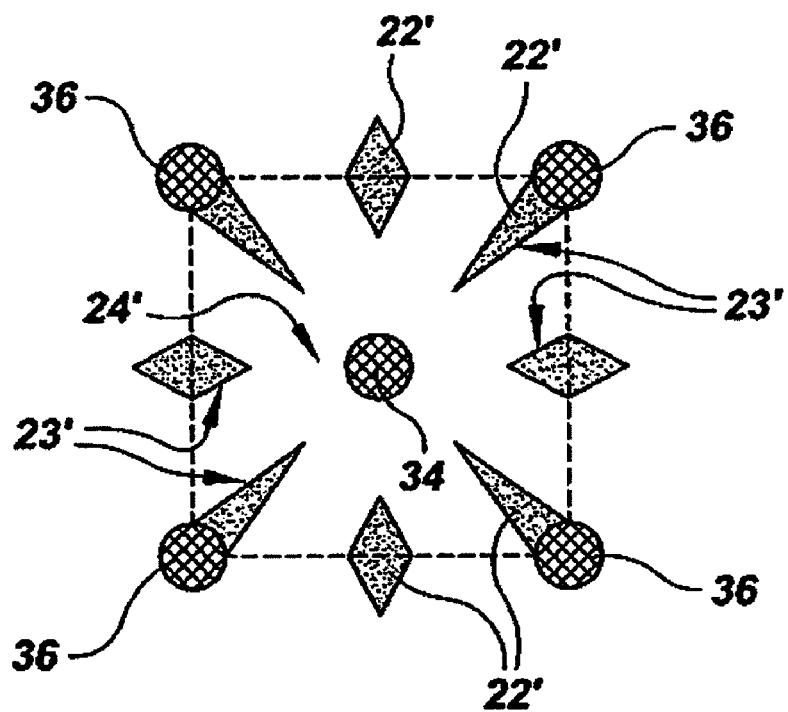

Referring to FIGS. 6A-6B, another modified cooling plate 20' of the invention is shown having predetermined surface features of only a plurality patterned fin structures 23'. Again, these fin structures 23' are formed within a starting substrate using known photolithography techniques to provide the modified cooling plate 20' of the invention. The fins 23' preferably do not extend into the location where the impinging jet stream of fluid is to contact the cooling plate surface 24', and as such, do not destroy the fluid thermal boundary layer under the fluid jet. Preferably, each fin 23' within the fin patterns is at least 0.75 microjet diameters away from a center of the cooling cell 32, which is also a center location of where the fluid is to impinge the surface 24' of the modified cooling plate 20'. Again, the plan shape of the fins is optimal if the spacing between fins keeps the flow area approximately constant as function of the distance to the jet center. Like that of the circular cavity embodiments, the fin patterns maintain the fluid velocity at the location where the fluid jet impinges the target surface 24', without an equivalent proportional increase in pressure drop, to thereby enhance the cooling capabilities of the thermal cooling assembly. The surface features of only fins 23' increases the exposed surface area of the cooling plate 20' even further, thereby maximizing the heat transfer capability within the assembly even more as compared to those embodiments having a circular cavities 21'.

Once the modified cooling plate 20' of the invention has been fabricated, the cooling plate 20' is permanently, or non-permanently, attached to the manifold 30 to form a single manifold-cooler assembly. That is, the modified cooling plate 20' is an integral part of the flow distribution system. The cooling plate 20' may be attached at all edges thereof to the thermal manifold 30 to form a fully encapsulated manifold-cooler assembly, or alternatively, openings or gaps may be remain within the attachment assembly for introduced other processing lines within the assembly. The manifold-cooler assembly is then attached to a heat generating component 10 (e.g., a semiconductor chip) via attachment means 15 for monitoring and controlling a thermal condition of the heat generating component 10.

Thus, the present thermal assemblies having modified cooling plates maximize both reliability and thermal performance of the thermal system. For instance, the below chart illustrates the thermal performances of a number of different modified cooling plates (i.e., cell designs A to J3) having various predetermined surface features of the invention that maintain the ejected jet fluid over the region where such fluid contacts the cooling plate surface at the center of a surface feature region associated with a cooling cell of the manifold to enhance the cooling capabilities of the assembly. These designs also have various amounts of cooling plate surface areas exposed to the ejected fluid, depending on the predetermined surface features. The below charts also show thermal performances of planar Reference cooling plates ("Ref-1 and Ref-2") having planar surfaces.

| Cell Design | Pattern | Feature Height Microns | $V_{jet}$ m/s | Jet-Jet Pitch microns | $h_{eq}$ $W/cm^2 K$ |
|---|---|---|---|---|---|
| Ref-1 | FIG. 1A | None | 2.0 | 435 | 5.6 |
| Ref-2 | FIG. 1A | None | 3.0 | 250 | 12.5 |
| A | FIG. 4A | 80 | 3.0 | 250 | 19.2 |
| B | FIG. 5A | 80 | 3.0 | 250 | 20.0 |
| C | FIG. 6A | 80 | 3.0 | 250 | 23.8 |
| F1 | FIG. 6A | 120 | 3.0 | 250 | 31.3 |
| F2 | FIG. 6A | 120 | 4.0 | 250 | 35.8 |
| G | FIG. 6A | 60 | 4.0 | 250 | 52.1 |
| H | FIG. 6A | 80 | 4.0 | 250 | 47.8 |
| J1 | FIG. 6A | 50 | 3.0 | 200 | 46.6 |
| J2 | FIG. 6A | 50 | 4.0 | 200 | 55.1 |
| J3 | FIG. 6A | 50 | 5.0 | 200 | 62.3 |

In the above table, the term $V_{jet}$ is referred to as the average jet velocity, and the term $h_{eq}$ is equivalent heat transfer coefficient using nominal area of the flat plate as the reference.

Figure 7:
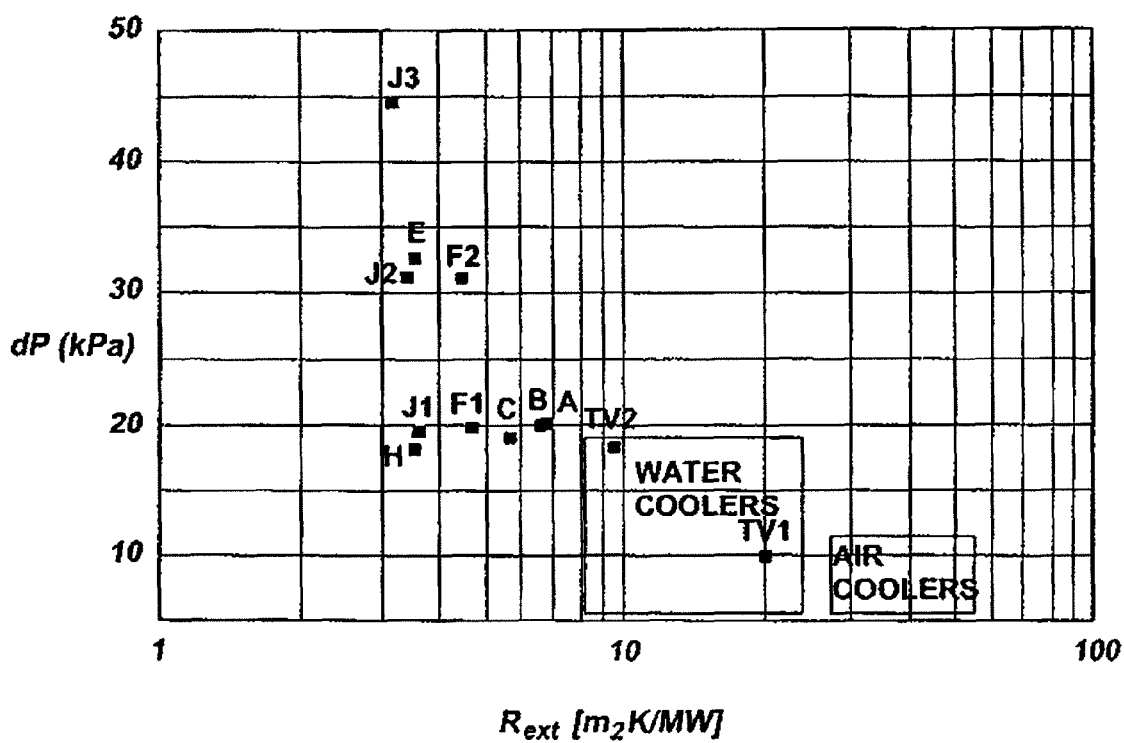
FIG. 7 illustrates a plot diagram of the minimal pressure drops associated with various designs of the present modified cooling plates for use in thermal assemblies.

As illustrated above, the cooling plates of the invention having surface features residing on a surface thereof may have maximized heat transfer coefficients and cooling capabilities up to about 5 times higher than those of the planar Reference cooling plates, while allowing for minimal pressure drops as shown in the plot diagram of FIG. 7, preferably while keeping the pressure drop increase below 10 kPa to 15 kPa relative to the pressure drop in coolers with planar surfaces, such as, Ref-1 and Ref-2 designs. The present thermal assemblies can be adapted to exceed about 400 W/cm$^2$ cooling with standard IC products, and can be adapted to provide above about 850 W/cm$^2$ with thin IC's.

EXAMPLE

To test the distribution systems of the invention, a number of thermal assemblies having modified cooling plates with surface features were tested and compared against assemblies having cooling plates with planar surface areas. All tested assemblies included a 200 μm thick Si base having cooling cell dimensions of 250 μm by 250 μm with inlet/outlet diameters of about 70 μm. Water was used as the cooling fluid with a microjet velocity of 3 m/s and an inlet temperature of about 20° C. The flux at the base bottom was about 1000 W/cm$^2$ while the gap between the cooling plate and the inlet/outlet array of the manifold was about 150 μm. The reference cooling capability ("q-ref") is estimated using calculated convective coefficient over a 0.4 mm total silicon thickness (chip+base) with 45° C. total thermal budget and 50 μm TIM with k=3 W/mK.

The thermal performances of these assemblies is shown below whereby the cell types include a reference cell ("Ref-2") having a planar cooling plate surface, a first cell ("Cell 1") having a first surface feature pattern (e.g., the circular cavity pattern of FIGS. 4A-B), a second cell ("Cell 2") having a second surface feature pattern (e.g., the circular cavity with fins pattern of FIGS. 5A-B), and a third cell ("Cell 3") having a third surface feature pattern (e.g., the fin pattern of FIGS. 6A-B). As demonstrated, depending on the configuration of the predetermined surface features and the more cooling plate surface area exposed to the ejected fluid (e.g., in Cell 3) in the present modified cooling plates, the higher and better the heat transfer coefficient and cooling capabilities of the assembly, while allowing for lower operating temperatures and minimal pressure drops.

| Cell Design | Ref-2 | Cell 1 | Cell 2 | Cell 3 |
|---|---|---|---|---|
| h (W/m$^2$K) | 125,000 | 192,000 | 200,000 | 466,000 |
| q-ref (W/cm$^2$) | 400 | 532 | 546 | 858 |
| Tmax. − Tmin. (° C.) | 95 | 67 | 65 | 33 |
| jet dP (kPa) | 18.2 | 20.3 | 20.2 | 19.8 |

While the above examples were performed using water as the cooling fluid, it should be appreciated and understood that a variety of other known cooling materials may be used in the present thermal assemblies. Fluids are preferred for high heat transfer rates since fluids have a substantially high heat transfer coefficient than gases. However, liquid metals and gases may also be employed within the present manifold for cooling surfaces of heat generating components.

It should be understood and appreciated that a number of thermal devices may be heated/cooled using the present a single modified cooling plate having varying predetermined surface features, or multiple modified cooling plates having the corresponding predetermined surface features as the devices in need of thermal control. The targeted surface areas of the present modified cooling plates may be heated and/or cooled in a continuous, identical manner across the entire target surface area, or alternatively, it may be heated and/or cooled non-uniformly. Wherein the target surface area is heated and/or cooled non-uniformly, the surface features of the modified cooling plates may be designed and configured to cool, heat, or simultaneously cool and heat different areas of the target surface at different rates and under different processing conditions based on varying surface features including, but not limited to, hierarchy, materials, dimensions, parameters, and the like. As such, the modified cooling plates may be provided with a variety of different surface patterns for heating/cooling a number of different types of thermal components, or different surface features on a thermal component, attached to the present modified cooling plates. For example, such a modified cooling plate of the invention would be ideal for cooling and/or heating of multichip modules.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A thermal distribution assembly comprising
   a plate having surface features residing on a surface thereof;
   an exposed surface area of said plate and said surface features;
   a manifold attached to said plate, said manifold having at least one microjet array and at least one distributed drain array;
   a cavity residing between said manifold and said exposed surface area;
   whereby said microjet array emits a fluid and said surface features of said plate delay a velocity decay of said fluid within a wall jet region of said cavity for enhancing thermal control of said assembly.

2. The assembly of claim 1 wherein said plate and said surface features comprise a same material.

3. The assembly of claim 1 wherein said plate and said surface features comprise different materials with compatible thermal coefficients of expansion.

4. The assembly of claim 1 further including a heat generating component attached to said plate for controlling a temperature of said heat generating component.

5. The assembly of claim 1 wherein an increase in surface area of said surface features increases said thermal control of said assembly.

6. The assembly of claim 1 wherein said surface features reside on said surface of said plate in locations such that said surface features preserve fluid vortexes created by said microjets within said cavity.

7. The assembly of claim 1 further including a plurality of cells within said manifold each having a microjet substantially at a center thereof, whereby said surface features have a configuration corresponding to said plurality of cells such that said surface features do not interfere with said fluid emitted from said microjet array.

8. The assembly of claim 7 wherein said surface features comprise a plurality of circular cavities, each of said circular cavities being aligned with a single cell.

9. The assembly of claim 8 wherein said plurality of circular cavities further include inwardly projecting fins.

10. The assembly of claim 7 wherein said surface features comprise a plurality of fin patterns, each of said fin patterns being aligned with a single cell.

11. The assembly of claim 1 wherein said surface features have a height ranging from about 30% to about 80% of a height of said cavity.

12. A system for thermal transfer comprising:
   a plate having a first surface and a second surface, said second surface having surface features residing thereon;
   a substrate having a temperature in need of modulating attached to said first surface of said plate;
   a manifold attached to said second surface of said plate, said manifold having a microjet array and at least one distributed drain array;
   a cavity residing between said manifold and said second surface of said plate having said surface features;
   whereby said microjet array emits a fluid into said cavity for contact with said second surface of said plate while said surface features on said second surface of said plate delay a velocity decay of said fluid for thermally controlling said temperature of said substrate.

13. A method for thermal control comprising:
   providing a plate;
   providing surface features on a surface of said plate;
   providing a manifold having a microjet array and at least one distributed drain array;
   forming an assembly by attaching said surface of said plate to said manifold such that said surface features avoid alignment with said microjets;
   emitting a fluid from said microjet array;
   contacting said fluid to said plate in locations of said surface area surrounded by said surface features, whereby said surface features delay a velocity decay of said fluid for enhancing thermal control of said assembly; and
   removing spent said fluid via said at least one distributed drain array.

14. The method of claim 13 wherein said surface features are formed in a starting plate material, such that, said plate and said surface features comprise a one-piece structure.

15. The method of claim 13 wherein said surface features are provided on a surface of said plate, said plate and said surface features comprising materials having compatible thermal coefficients of expansion.

16. The method of claim 13 wherein a variety of different surface features reside across said exposed surface area of said plate for controlling a variety of different temperatures across said plate surface using said fluid or a plurality of different fluids.

17. The method of claim 13 further including a plurality of cells within said manifold each having a microjet substantially at a center thereof, whereby said surface features have a configuration corresponding to said plurality of cells such that said surface features do not interfere with said fluid emitted from said microjet array.

18. The method of claim 17 wherein said surface features comprise a plurality of circular cavities, each of said circular cavities being aligned with a single cell.

19. The method of claim 18 wherein said plurality of circular cavities further include inwardly projecting fins.

20. The method of claim 17 wherein said surface features comprise a plurality of fin patterns, each of said fin patterns being aligned with a single cell.

* * * * *